United States Patent
Courtel

(10) Patent No.: US 8,653,871 B1
(45) Date of Patent: Feb. 18, 2014

(54) COUNTER CIRCUIT

(71) Applicant: Atmel Corporation, San Jose, CA (US)

(72) Inventor: Karl Jean-Paul Courtel, Reze (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/672,940

(22) Filed: Nov. 9, 2012

(51) Int. Cl.
*H03K 3/017* (2006.01)

(52) U.S. Cl.
USPC .............. 327/176; 327/175; 377/54; 377/114

(58) Field of Classification Search
USPC .................. 327/172–176; 377/54, 56, 114
See application file for complete search history.

(56) References Cited

U.S. PATENT DOCUMENTS

| | | | | |
|---|---|---|---|---|
| 4,236,114 A | * | 11/1980 | Sasaki | 327/176 |
| 5,406,132 A | * | 4/1995 | Housako | 327/172 |
| 5,430,781 A | * | 7/1995 | Miyake et al. | 377/39 |
| 6,448,827 B1 | * | 9/2002 | Tojima | 327/172 |
| 6,636,094 B2 | * | 10/2003 | Onde | 327/172 |
| 7,375,506 B2 | | 5/2008 | Courtel | |
| 8,270,135 B2 | | 9/2012 | Thiele | |
| 2006/0050876 A1 | | 3/2006 | Courtel | |
| 2012/0313545 A1 | | 12/2012 | Courtel | |
| 2013/0010508 A1 | | 1/2013 | Courtel | |
| 2013/0044529 A1 | | 2/2013 | Proca et al. | |
| 2013/0154602 A1 | | 6/2013 | Courtel | |

* cited by examiner

*Primary Examiner* — William Hernandez
(74) *Attorney, Agent, or Firm* — Fish & Richardson P.C.

(57) ABSTRACT

A counter circuit includes two pairs of registers configured to swap contents based on a timer overflow or underflow condition. The counter circuit also includes a waveform generator that generates a composite pulse width modulated signal with a period and duty cycle specified by values stored in the registers. A demultiplexing circuit generates first and second signals from the composite signal.

20 Claims, 4 Drawing Sheets

COUNTER CIRCUIT

TECHNICAL FIELD

This disclosure relates generally to electronics and more particularly to counter circuits configured to generate pulse width modulated signals.

BACKGROUND

Some conventional timer circuits use a counter circuit to time out specific time intervals. The counter circuit increments a counter value at known, fixed time increments, e.g., according to a clock signal or a divided clock signal. To time out a specified time interval, the counter circuit determines a threshold count equal to the duration of the specified time interval divided by the fixed time increment. The counter circuit compares the threshold count to the counter value while incrementing the counter value, and when the counter value reaches the threshold count, the timer circuit determines that the specified time interval has passed.

A counter circuit can generate a pulse width modulated signal using a waveform generator. The duty cycle and frequency of the pulse width modulated signal specify that the signal should be at a logic high level during a specified time interval and a logic low level until the end of timer period (counter overflow). The waveform generator generates the signal using the counter circuit to time out the first time interval and timer periods (counter overflow).

SUMMARY

A counter circuit includes two pairs of registers configured to swap contents based on a timer overflow or underflow condition. The counter circuit also includes a waveform generator that generates a composite pulse width modulated signal with a period and duty cycle specified by values stored in the registers. A demultiplexing circuit generates first and second signals from the composite signal.

Particular implementations of the testing circuit can provide one or more of the following advantages: 1) a counter circuit can generate two pulse width modulated signals using fewer registers and/or comparators than conventional circuits; 2) the power consumption of a microcontroller using such a counter circuit can be reduced compared to conventional microcontrollers; and 3) the counter circuit can control a switching mode power supply with asymmetrical commands for high side and low side driver circuits.

The details of one or more disclosed implementations are set forth in the accompanying drawings and the description below. Other features, aspects, and advantages will become apparent from the description, the drawings and the claims.

DETAILED DESCRIPTION

Example Microcontroller System

Figure 1:
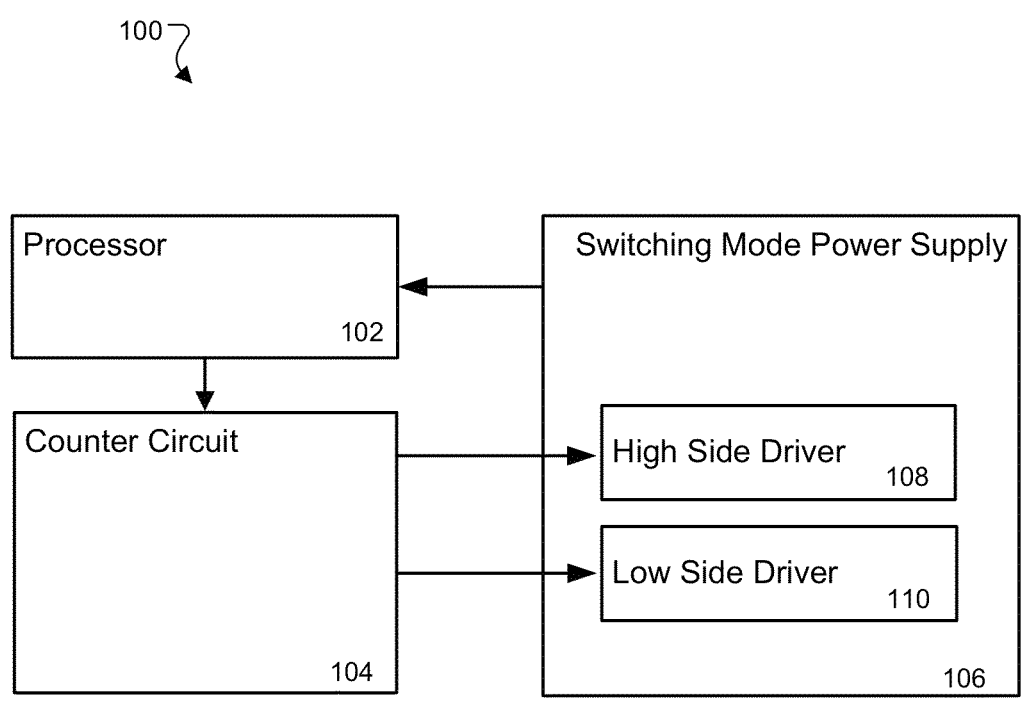
FIG. 1 is a block diagram of an example electronic system.

FIG. 1 is a block diagram of an example electronic system 100. The system includes a processor 102, a counter circuit 104, and a switching mode power supply 106. In some implementations, the processor and the counter circuit are integrated on a chip as a microcontroller and the switching mode power supply is external to the chip.

The switching mode power supply includes a high side driver 108 and a low side driver 110. The counter circuit provides two pulse width modulated signals to the switching mode power supply, one for the high side driver and one for the low side driver. The counter circuit can be, e.g., the counter circuit 200 illustrated in FIG. 2.

The counter circuit generates the two signals using parameters supplied by the processor. The parameters specify, for each signal, a period and a pulse duration. The processor can monitor the switching mode power supply, e.g., by receiving a signal from the switching mode power supply or from a sensor on an output on the switching mode power supply, and then adjust the parameters of the counter circuit. For example, the processor can adjust the parameters to maintain a target output voltage of the switching mode power supply.

Example Counter Circuit

Figure 2:
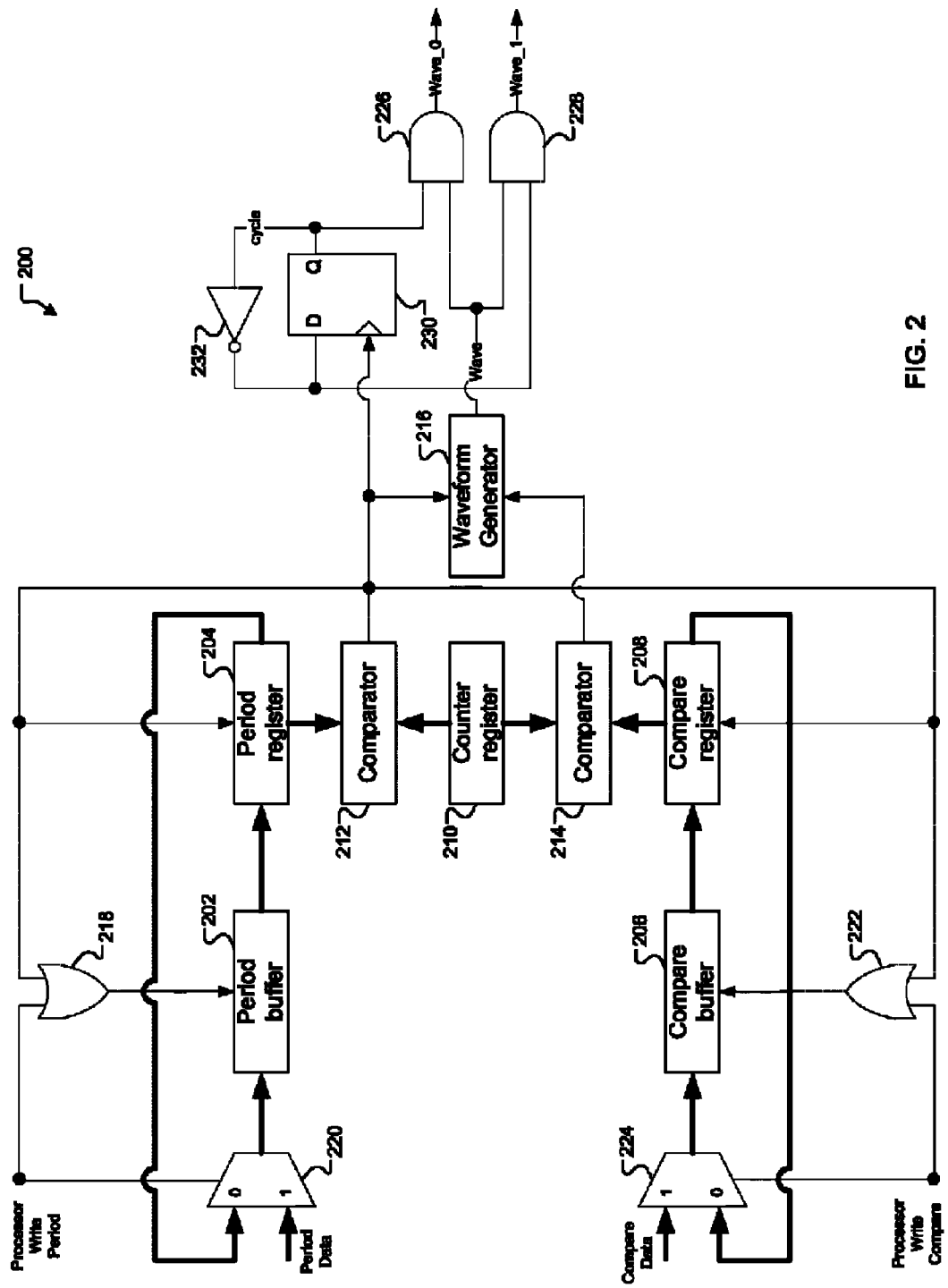
FIG. 2 is a block diagram of an example counter circuit that is configured to generate two pulse width modulated signals.

FIG. 2 is a block diagram of an example counter circuit 200 that is configured to generate two pulse width modulated signals. The signals are labeled "Wave_0" and "Wave_1."

The counter circuit includes a first pair of registers 202 and 204 forming a circular buffer and a second pair of registers 206 and 208 forming another circular buffer. The counter circuit includes a counter register 210 storing a counter value. The counter circuit can increment the counter value or decrement the counter value, and typically, the counter circuit increments or decrements the counter value at periodic intervals.

The counter circuit includes two comparators 212 and 214. The first comparator 212 is coupled to the period register 204 and, in operation, compares the counter value with an update value stored in the period register. The output of the first comparator is coupled to an input of a waveform generator 216. The second comparator is coupled to the compare register 208 and, in operation, compares the counter value with a match value stored in the compare register. The output of the second comparator is also coupled to the waveform generator.

The first pair of registers 202 and 204 are configured to swap contents when the counter circuit increments or decrements a counter value to an update count stored in the period register. The period buffer 202 and the period register 204 each store an update count. One of the update counts specifies the period of the first signal, and the other update count specifies the period of the second signal.

The output of the first comparator is coupled to the first pair of registers so that, in operation, when the counter value reaches whichever update count is stored in the period register, the pair of registers swap contents. The second pair of registers 206 and 208 are also configured to swap contents when the counter circuit increments or decrements the counter value to the update count stored in the period register by virtue of the output of the first comparator also being coupled to the load command of second pair of registers.

The compare register 208 and the compare buffer 206 each store a match count. One of the match counts specifies the pulse duration of the first signal, and the other match count specifies the pulse duration of the second signal.

The counter circuit includes an interface so that a processor, e.g., the processor 102 of FIG. 1, can write new values for the update counts and the match counts into the compare buffer 206 and the period buffer 202. The interface includes, for the update counts, a first OR gate 218 and a multiplexer 220. A signal from the processor, "Processor Write Period," causes the multiplexer to select new period data from the processor. The processor write has priority over the registers swapping contents.

The signal from the processor is also coupled to the OR gate 218. The other input to the OR gate 218 is coupled to the output of the first comparator, and the output of the OR gate 218 is coupled to the period buffer 202.

The interface also includes, for the match counts, a second OR gate 222 and a second multiplexer 224. The "Processor Write Compare" signal causes the multiplexer to select new compare data from the processor. The processor write has priority over the registers swapping contents.

The waveform generator 216 includes an output coupled to a demultiplexing circuit. The demultiplexing circuit includes a pair of AND gates 226 and 228, a D flip-flop 230, and an inverter 232. The output of the waveform generator produces a signal, labeled "Wave," and is coupled to one input of each of the AND gates 226 and 228. The output of the first AND gate 226 produces the "Wave_0" signal and the output of the second AND gate produces the "Wave_1" signal.

The other input of the first AND gate 226 is coupled to the Q terminal of the D flip-flop and the input of the inverter. The output of the inverter is coupled to the D terminal of the D flip-flop and the other input of the second AND gate 228. The output of the first comparator 212 is coupled to the clock input, or enable of the clock input, of the D flip-flop. In operation, the "cycle" signal output from the D flip-flop cause the demultiplexing circuit to output the Wave signal on either the first AND gate 226 or the second AND gate 228.

Example Timing Diagram

Figure 3:
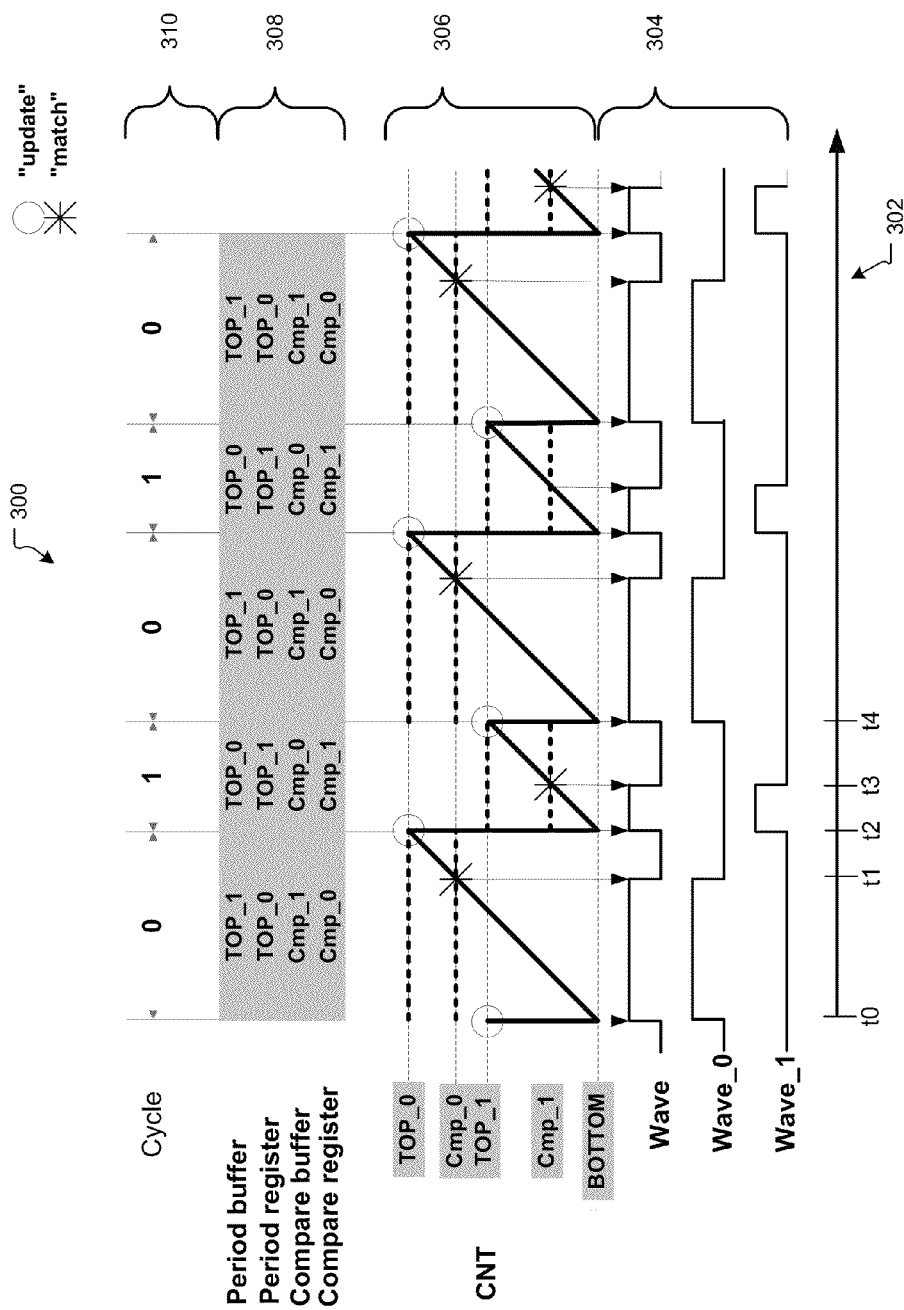
FIG. 3 is a timing diagram illustrating the operation of the example counter circuit of FIG. 2.

FIG. 3 is a timing diagram 300 illustrating the operation of the example counter circuit 200 of FIG. 2. The timing diagram illustrates various states of the counter circuit along a timeline 302. In this example, the counter circuit is incrementing the counter value, but in other examples the counter circuit can decrement the counter value.

The bottom section 304 shows three waveforms, the composite "Wave" output from the waveform generator 216, the demultiplexed "Wave_0" output from the first AND gate 226, and the demultiplexed "Wave_1" output from the second AND gate 228. The previous section 306 shows the counter value in comparison with the update count and match count. The previous section 308 shows which update count is stored in the period buffer and period register and which match count is stored in the compare buffer and the compare register. The previous section illustrates the state of the "cycle" signal output from the D flip-flop.

At time t0, the counter circuit initializes the counter value to 0 and begins incrementing the counter. The Wave signal is initialized high. The Wave signal can alternatively be initialized low. The cycle signal is low, so the demultiplexing circuit is outputting the Wave signal on the first AND gate, and the Wave_0 signal is high while the Wave_1 signal is low. The period buffer is storing an update count, "TOP_1," and the period register is storing another update count, "TOP_0." The compare buffer is storing a match count, "Cmp_1," and the compare register is storing another match count, "Cmp_0."

At time t1, the counter value reaches the match count stored in the compare register, Cmp_0. In response, the Wave signal falls, and thus the Wave_0 signal also falls. If the Wave signal was initialized low, then the Wave signal rises. At time t2, the counter value reaches the update count stored in the period register, Top_0. The counter circuit resets the counter value to 0, the period buffer and the period register swap contents, and the compare buffer and the compare register swap contents. The cycle signal rises and the Wave signal rises. Because the cycle signal is high, and demultiplexing circuit is outputting the Wave signal on the second AND gate, the Wave_0 is high and the Wave_1 signal is low.

At time t3, the counter value reaches the match count stored in the compare register, Cmp_1. In response, the Wave signal falls, and thus the Wave_1 signal also falls. At time t4, the counter value reaches the update count stored in the period register, Top_1. The counter circuit resets the counter value to 0, the period buffer and the period register swap contents, and the compare buffer and the compare register swap contents. The process repeats in a similar fashion, e.g., until the processor changes one of the update counts or one of the match counts into one of the circular buffers.

Example Flow Diagram

Figure 4:
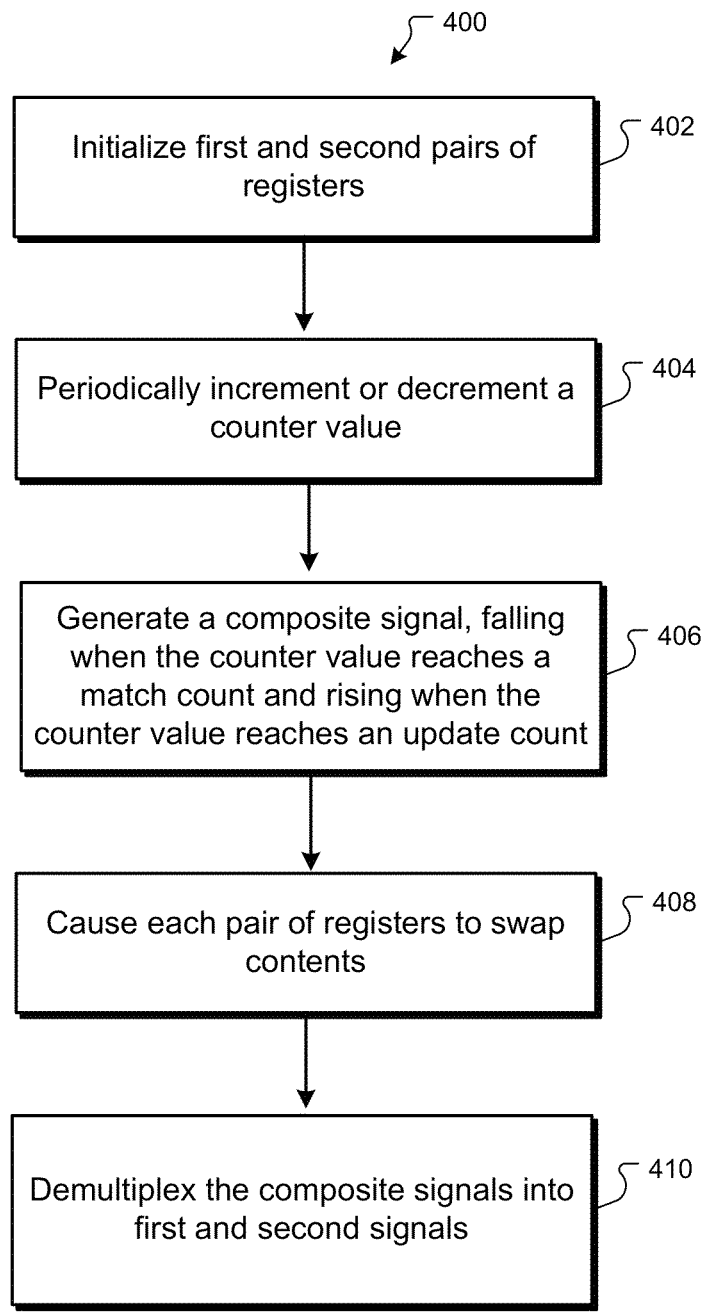
FIG. 4 is a flow diagram of an example process performed by a counter circuit.

FIG. 4 is a flow diagram of an example process 400 performed by a counter circuit, e.g., the counter circuit 200 of FIG. 2.

The counter circuit initializes first and second pairs of registers by receiving values from a processor, e.g., a central processing unit (CPU) (402). The counter circuit periodically increments or decrements a counter value (404). The counter circuit generates a composite signal (406). For example, the counter circuit can generate the Wave signal illustrated in FIG. 3. The composite signal falls when the counter value reaches a match count stored in the second pair of registers, and the composite signal rises when the counter value reaches an update counts stored in the first pair of registers.

In response to the counter value reaching the update count, the counter circuit causes each pair of registers to swap contents (408). The counter circuit demultiplexes the composite signal into first and second signals (410). For example, the counter circuit can demultiplex the signal by alternately sending the composite signal to one output and then to another output.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A counter circuit comprising:
   a first pair of registers configured to swap contents when the counter circuit increments or decrements a counter value to a first update count, one of the first pair of registers storing the first update count;
   a second pair of registers configured to swap contents when the counter circuit increments or decrements the counter value to the first update count;
   a waveform generator configured to generate a composite signal, wherein the waveform generator is configured to cause the composite signal to invert when the counter circuit increments or decrements the counter value to the first update count, and wherein the waveform generator is configured to cause the composite signal to invert when the counter circuit increments or decrements the counter value to a first match count, one of the second pair of registers storing the first match count; and a demultiplexing circuit coupled to the waveform generator and configured to generate first and second signals from the composite signal.

2. The counter circuit of claim 1, further comprising a counter register configured to store the counter value, wherein the counter circuit is configured to periodically increment or decrement the counter value.

3. The counter circuit of claim 1, wherein the counter circuit is configured to store the first update count in one of the first pair of registers and a second update count in the other of the first pair of registers, the first update count specifying a first period of the first signal and the second update count specifying a second period of the second signal.

4. The counter circuit of claim 3, wherein the counter circuit is configured to store the first match count in one of the second pair of registers and a second match count in the other of the second pair of registers, the first match count specifying a first pulse duration of the first signal and the second match count specifying a second pulse duration of the second signal.

5. The counter circuit of claim 1, further comprising an interface configured to receive a new update count from a processor and write the new update count to one of the first pair of registers, and to receive a new match count from the processor and write the new match count to one of the second pair of registers.

6. The counter circuit of claim 1, wherein the demultiplexing circuit comprises:
a flip-flop configurable between first and second states, wherein the flip-flop is configured to change from one state to the other when the when the counter circuit increments or decrements the counter value past the first update count;
a first logic gate configured to qualify the first signal from the composite signal by enabling the output of the composite signal when the flip-flop is in the first state; and
a second logic gate configured to qualify the second signal from the composite signal by enabling the output of the composite signal when the flip-flop is in the second state.

7. The counter circuit of claim 6, wherein the flip-flop is a D flip-flop and the first and second logic gates are AND gates, and wherein each AND gate comprises a respective first input coupled to an output of the waveform generator and a respective second input coupled to the D flip-flop.

8. A method performed by a counter circuit, the method comprising:
initializing a first pair of registers to store first and second update counts;
initializing a second pair of registers to store first and second match counts;
periodically incrementing or decrementing a counter value; and
generating a composite signal and demultiplexing the composite signal to generate first and second signals, wherein generating the composite signal comprises:
determining that the counter value has reached a selected match count selected from the second pair of registers, and, in response, causing the composite signal to invert its polarity
determining that the counter value has reached a selected update count selected from the first pair of registers, and, in response, causing the composite signal to reinitialize to a given polarity and causing the first pair of registers to swap contents and causing the second pair of registers to swap contents.

9. The method of claim 8, wherein initializing the first pair of registers comprises storing the first update count in one of the first pair of registers and the second update count in the other of the first pair of registers, the first update count specifying a first period of the first signal and the second update count specifying a second period of the second signal.

10. The method of claim 8, wherein initializing the second pair of registers comprises storing the first match count in one of the second pair of registers and the second match count in the other of the second pair of registers, the first match count specifying a first pulse duration of the first signal and the second match count specifying a second pulse duration of the second signal.

11. The method of claim 8, further comprising receiving a new update count from a processor and writing the new update count to one register of the first pair of registers.

12. The method of claim 11, further comprising receiving a new match count from the processor and writing the new match count to one register of the second pair of registers.

13. The method of claim 8, wherein demultiplexing the composite signal comprises outputting, to a first output, the composite signal until determining that the counter value has reached the selected update count, and then outputting the composite signal to a second output.

14. The method of claim 8, wherein demultiplexing the composite signal to generate first and second signals comprises driving a high side driver of a half-bridge with the first signal and driving a low side driver of the half-bridge with the second signal.

15. A microcontroller system comprising:
a processor;
a half-bridge circuit comprising a high side driver and a low side driver; and
a counter circuit coupled to the processor and the half-bridge circuit, the counter circuit comprising:
a first pair of registers configured to swap contents when the counter circuit increments or decrements a counter value to a first update count, one of the first pair of registers storing the first update count;
a second pair of registers configured to swap contents when the counter circuit increments or decrements the counter value to the first update count;
a waveform generator configured to generate a composite signal, wherein the waveform generator is configured to cause the composite signal to invert when the counter circuit increments or decrements the counter value to the first update count, and wherein the waveform generator is configured to cause the composite signal to invert when the counter circuit increments or decrements the counter value to a first match count, one of the second pair of registers storing the first match count; and
a demultiplexing circuit coupled to the waveform generator and configured to generate first and second signals from the composite signal, the first signal driving the high side driver and the second signal driving the low side driver.

16. The microcontroller system of claim 15, further comprising a counter register configured to store the counter value, wherein the counter circuit is configured to periodically increment or decrement the counter value.

17. The microcontroller system of claim 15, wherein the counter circuit is configured to store the first update count in one of the first pair of registers and a second update count in the other of the first pair of registers, the first update count specifying a first period of the first signal and the second update count specifying a second period of the second signal.

18. The microcontroller system of claim 17, wherein the counter circuit is configured to store the first match count in one of the second pair of registers and a second match count in the other of the second pair of registers, the first match count specifying a first pulse duration of the first signal and the second match count specifying a second pulse duration of the second signal.

19. The microcontroller system of claim 15, wherein the processor is configured to write a new update count to one of the first pair of registers and write a new match count to one of the second pair of registers.

20. The microcontroller system of claim 15, wherein the demultiplexing circuit comprises:
- a flip-flop configurable between first and second states, wherein the flip-flop is configured to change from one state to the other when the counter circuit increments or decrements the counter value past the first update count;
- a first logic gate configured to generate the first signal from the composite signal by outputting the composite signal when the flip-flop is in the first state; and
- a second logic gate configured to generate the second signal from the composite signal by outputting the composite signal when the flip-flop is in the second state.

* * * * *